Figure 1:
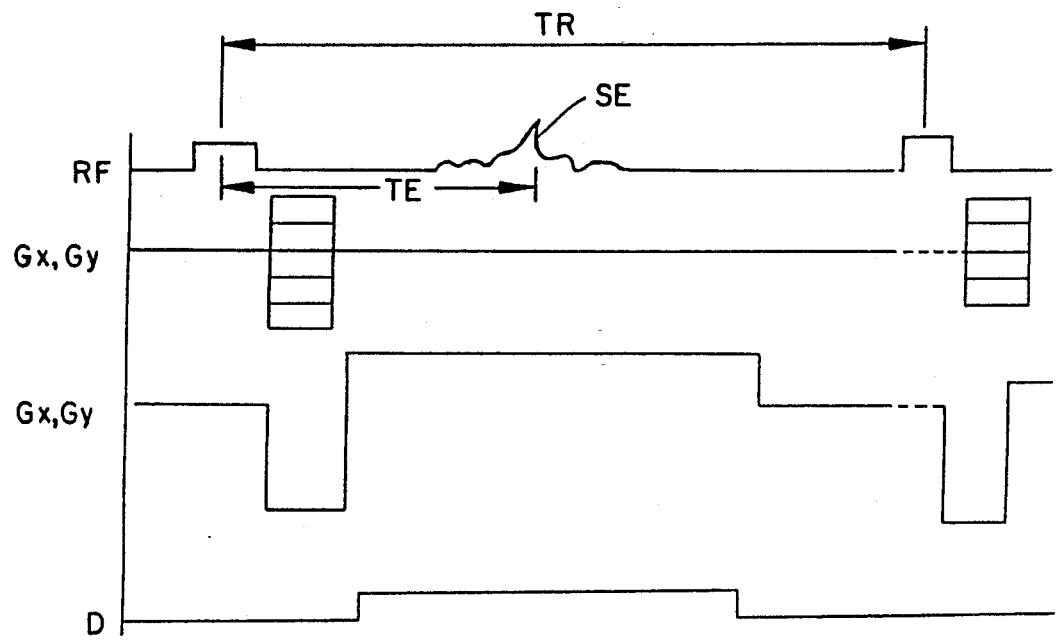

United States Patent [19]

Sepponen

[11] Patent Number: 5,227,723
[45] Date of Patent: Jul. 13, 1993

[54] IMAGING METHOD

[75] Inventor: Raimo Sepponen, Helsinki, Finland

[73] Assignee: Instrumentarium Corp., Finland

[21] Appl. No.: 580,818

[22] Filed: Sep. 11, 1990

[30] Foreign Application Priority Data

May 29, 1990 [FI] Finland ................................. 902667

[51] Int. Cl.$^5$ ............................................. G01V 3/00
[52] U.S. Cl. ................................. 324/307; 324/309
[58] Field of Search ............... 324/309, 307, 312, 306; 128/653.2

[56] References Cited

U.S. PATENT DOCUMENTS 4,841,247 6/1989 Itagaki ................................. 324/309
4,993,075 2/1991 Sekihara et al. ..................... 324/309

OTHER PUBLICATIONS

Ljunggren, S.: A simple graphical representation of Fourier-based imaging methods. J. Magn. Reson., vol. 54, pp. 338–343, 1983.

Primary Examiner—Louis Arana
Attorney, Agent, or Firm—Andrus, Sceales, Starke & Sawall

[57] ABSTRACT

The invention relates to a method based on the NMR phenomenon and magnetic resonance imaging techniques for the examination of an object, such as a human body, an animal or a tree trunk, wherein the image-related information is collected by effecting several times the operations required by a so-called imaging sequence, wherein the excitation procedure is followed by coupling across the object a magnetic field gradient, a so-called phase-encoding gradient, produced as a resultant of one or more divergent gradient fields, and thereafter a so-called read-out gradient during which a nuclear magnetic resonance signal is collected. One or more component gradient fields of said phase-encoding gradient produce a read-out gradient in some of the sequence repetition times.

5 Claims, 1 Drawing Sheet

IMAGING METHOD

The present invention relates to an imaging method based on nuclear magnetic resonance for the examination of e.g. a human body, animals, foodstuffs or a tree trunk.

Magnetic resonance imaging (MRI) is a method which utilizes a nuclear magnetic resonance phenomenon (NMR) for detecting the nuclear density or nucleus-related NMR properties of an object or the local distributions of physical and chemical properties having an effect thereon. Said NMR properties include e.g.: longitudinal relaxation (characterized by longitudinal relaxation time T1), transverse relaxation (characterized by transverse relaxation time T2), relaxation in a rotating frame of reference (characterized by relaxation time T1rho), chemical shift, and coupling: factors between the nuclei. The physical phenomena having an effect on NMR properties include e.g.: flow rate, diffusion, paramagnetic materials, ferromagnetic materials, viscosity and temperature.

Magnetic resonance and magnetic resonance imaging methods and applications have been described in a number of references: Wehrli FW, Shaw D, Kneeland RJ: Biomedical Magnetic Resonance Imaging, VCH Publishers, Inc., New York 1988, Stark DD and Bradley WG: Magnetic resonance imaging, C. V. Mosby Comp., St. Louis 1988, Gadian DG: Nuclear magnetic resonance and its applications to living systems, Oxford Univ. Press, London 1982, Shaw D: Fourier transform NMR spectroscopy, Elsevier, Amsterdam, 1984, Battocletti JH: NMR proton imaging, CRC Crit. Rev. Biomed. Eng. vol. 11 pp. 313–356, 1984, Mansfield P and Morris PG: NMR imaging in biomedicine, Adv. in magnetic resonance, Academic Press, New York 1982, Abragam A:

The principles of nuclear magnetism, Clarendon Press, Oxford 1961, Farrar TC, Becker ED: Pulse and Fourier Transform NMR, Academic Press, New York 1971, Lasker SE and Milvy P (eds.): Electron spin resonance and nuclear magnetic resonance in biology and medicine and magnetic resonance in biological systems, Annals of New York Academy of Sciences vol. 222, New York Academy of Sciences, New York 1973, Sepponen RE: Discrimination and characterization of biological tissues with magnetic resonance imaging: A study on methods for T1, T2, T1rho and chemical shift imaging, Acta polytechnica scandinavica EL-56, Helsinki 1986, Fukushima E and Roeder SB: Experimental pulse NMR, Addison Wesley, London 1981, Thomas SR and Dixon RL (eds.) NMR in medicine: The instrumentation and clinical applications, Medical Physics Monograph No. 14, American Institute of Physics, New York 1986, Anderson WA et al: U.S. Pat. No. 3,475,680, Ernst RR: U.S. Pat. No. 3,501,691, Tomlinson BL et al: U.S. Pat. No. 4,034,191, Ernst RR: U.S. Pat. No. 3,873,909, Ernst RR: U.S. Pat. No. 4,070,611, Bertrand RD et al: U.S. Pat. No. 4,345,707, Young IR U.S. Pat. No. 4,563,647, Hofer DC et al: U.S. Pat. No. 4,110,681, Savolainen MK: Magnetic resonance imaging at 0.02 T: Design and evaluation of radio frequency coils with wave winding, Acta Polytechnica Scandinavica Ph 158, Helsinki 1988, Sepponen RE: U.S. Pat. No. 4,743,850, Sepponen RE: U.S. Pat. No. 4,654,595, Savolainen MK: U.S. Pat. 4,712,068, Sepponen RE: U.S. Pat. No. 4,587,493, Savolainen MK: U.S. Pat. No. 4,644,281 and Kupiainen J: U.S. Pat. No. 4,668,904.

In addition, the signal-to-noise ratio can be improved with certain provisions by using a so-called Overhauser phenomenon, as described in references: Ettinger KV: U.S. Pat. No. 4,719,425 discloses as applications the mapping of concentrations of paramagnetic components and the mapping of the activity of cerebral nerve cells. The references Lurie DJ, Bussel DM, Bell LH, Mallard JR: Proton Electron Double Resonance Imaging: A new method for imaging free radicals, Proc. S.M.R.M. Fifth Annual Meeting, 1987, New York, p. 24 and Lurie DJ, Bussel DM, Bell LH, Mallard JR: Proton-Electron Double Magnetic Resonance Imaging of free radical solutions, J. Magn. Reson., vol. 76, 1988, pp. 366–370 disclose the mappings of free radical groups, nitroxide radicals and degree of oxidation as possible applications.

Signal collection strategies can be studied by means of a so-called k-space representation. This approach has been used e.g. in references: Twieg DB: The k-trajectory formulation of the NMR-imaging process with applications in analysis and synthesis of imaging methods. Med. Phys., vol. 10, pp. 610–621, 1983 and Ljunggren S: A simple graphical representation of Fourier-based imaging methods. J. Magn. Reson., vol 54, pp. 338–343, 1983.

The examination of a three-dimensional object is often speeded up by using so-called multiple slice imaging. The principle of multiple slice or multislice imaging is described e.g. in reference Crooks LE: Selective irradiation line scan techniques of NMR imaging, IEEE Trans. Nucl. Sci., vol. 27, pp. 1239–1241, 1980.

The imaging has been speeded up by developing pulse sequences in which the excitation angle is small and a spin echo is produced by gradient operations and which has been described e.g. in references Frahm J, Haase A, Matthaei D, Haenicke W, Merboldt K-D: U.S. Pat. Nos. 4,707,658 and Gyngnell ML: 4,699,148, earlier in references Tanttu J: Test apparatus for NMR imaging, Graduation Thesis, Helsinki Technical University, Department of Technical Physics, 1982, p. 69 and Pohjonen J: Test apparatus for the NMR imaging of a moving object, Licentiate Thesis, Helsinki Technical University, Department of Technical Physics, 1984, pp. 39–40.

The contrast of images formed by these imaging sequences has been described e.g. in reference Buxton RB, Fisel CR, Chien D, Brady TJ: Signal intensity in fast NMR imaging with short repetition times, J. Magn. Reson., vol. 83, pp. 576–585, 1989. By selecting excitation angle a, repetition time (TR), echo delay (TE) as advised in the references the contrast forming in the image can be maximized for a selected pair of components (e.g. white and gray substance of the brain).

A weakness in NMR methods is a poor signal-to-noise ratio which also applies to magnetic resonance imaging. The signal-to-noise ratio can be improved by averaging the signals which, in turn, increases the imaging time. The signal-to-noise ratio increases in proportion to the square root of the number of averagings. The imaging strategy must be such that the resolution of an image corresponds to the available signal-to-noise ratio: Too high a resolution produces an image with a poor signal-to-noise ratio and, on the other hand, a low resolution may lead to an unacceptable image.

Optimization of the signal collection strategy is preferably effected e.g. in cases where the strength of a polarizing magnetic field is low or the imaging speed should be as high as possible.

In practice, a signal must be collected in a manner that the corresponding image resolution is higher than what would be allowed by the signal-to-noise ratio. Thus, in order to improve the final image, either the signal or the final image is processed with various types of filtration techniques. Filtration is used to remove some of the noise accumulated during signal collection. Thus, some of the time used for signal collection is wasted.

An imaging method of the invention is capable of optimizing the actual imaging process in a manner that the band width of a signal collected during imaging corresponds to the resolution of a final image and, thus, the entire imaging time can be effectively utilized. The method is particularly suitable for the examination of large, relatively homogeneous objects, such as e.g. a human body.

The invention is illustrated in the accompanying drawings, in which

Figure 2:
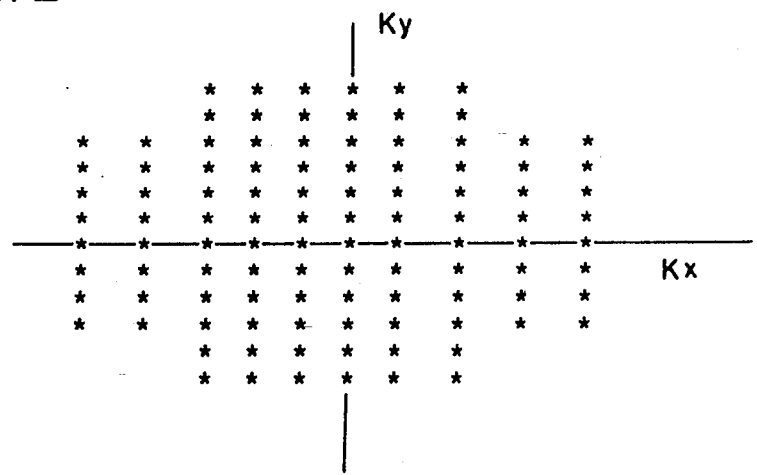

FIG. 1 shows one imaging sequence of the invention for the two-dimensional imaging of an object, FIG. 2 shows an imaging strategy of the invention as a trajectory in the k-space.

FIG. 1 illustrates a pulse diagram for an imaging sequence of the invention. The excitation pulses are described on an axis RF and have a repetition rate TR, an echo delay TE and an excitation angle selected to be optimal relative to contrast, signal-to-noise ratio and imaging time. Between the excitation pulses occur the gradient operations which are required by magnetic resonance imaging and depicted by axes $G_x$ and $G_y$. As a result of gradient operations, the protons of an object emit a recordable spin echo SE which is created after a period TE from an excitation pulse. A signal collection process of the invention can be conceived as a two-phase operation in a manner that, first of all, the phase-coding gradient comprises a y-directed gradient $G_y$ and the read-out gradient is an x-directed gradient $G_x$. After performing the phase-coding operations required by y-directed resolution, the imaging operations are effected in a manner that the phase-coding gradient is an x-directed gradient $G_x$ and the read-out gradient is a y-directed gradient $G_y$. The imaging is completed after reaching a desired resolution in x-direction.

FIG. 1 illustrates a simplified imaging sequence required by two-dimensional imaging. The action of a slice-selection gradient is not shown. In a three-dimensional case, the phase-coding gradient can be conceived as being formed of two orthogonal gradient fields. Thus, according to the invention, each component of a phase-coding gradient serves as a read-out gradient in some of the repetition times of an imaging sequence.

FIG. 2 illustrates in k-trajectory a signal collection strategy of the invention. According to the imaging strategy, those points of k-trajectory would not be collected which have a weak signal-to-noise ratio. In a large and homogeneous object, such as a human body, those are the areas in which the encoding of spin population in x-and y-direction caused by the gradients is great. The reading of these points can be set to be 0 or one of the readings of measuring points, e.g. by interpolating or extrapolating the derived values.

As illustrated in the figure, the points in the center of k-trajectory are collected twice according to the invention. This provides for a signal-to-noise ratio for such sections of an object which have a low resolution. This diminishes the movement artifacts which complicate interpretation of the image and improves uniformity of the image.

The characteristics of the method in this respect can also be changed by varying the number of averagings according to any given degree of phase encoding. For example, it is possible to collect several times that signal which has a minor phase coding for thus improving visuality of the image especially in cases when the signal-to-noise ratio is very poor. Such cases include e.g. highly relaxation weighted images and very rapidly collected images.

While the above specification only deals with one embodiment of the invention, it will be understood that modifications can be made thereto and it is intended to cover all such modifications as fall within the scope of the appended claims.

I claim:

1. A method of producing an NMR image of an object, said object being subjected to an external magnetic field assuming an arbitrarily designated z axis, said z axis having mutually orthogonally x and y axes oriented orthogonal thereto, said image being formed from a matrix of data points lying in a $k_x$-$k_y$ plane, said method comprising the steps of:
  (a) applying an RF excitation pulse to the object;
  (b) applying a phase encoding magnetic field gradient to the object having a direction of one of the x or y axes;
  (c) applying a readout magnetic field gradient orthogonally to said phase encoding gradient;
  (d) collecting NMR signal data;
  (e) repeating the foregoing steps with different time integrals of the phase encoding gradient;
  (f) repeating the steps a–d but selecting the direction of the phase encoding gradient as the one of the x or y axes not previously used, the collection of NMR signal data obtained in the repetitious steps of the method forming a matrix of NMR data points;
  (g) filling missing data points of the data matrix with calculated data; and
  (h) developing an NMR image from the data of the data matrix.

2. The method according to claim 1 further including the step of applying a slice selection magnetic field gradient to the object.

3. The method according to claim 1 wherein the step of filling in the missing data points is further defined as setting these data points at zero.

4. The method according to claim 1 wherein the step of filling in the missing data points is further defined as setting these data points at calculated values.

5. The method according to claim 1 wherein the data image is developed using Fourier transform.

* * * * *